United States Patent
Li et al.

(10) Patent No.: US 8,054,629 B2
(45) Date of Patent: Nov. 8, 2011

(54) MICROFINS FOR COOLING AN ULTRAMOBILE DEVICE

(75) Inventors: Zhihua Li, Chandler, AZ (US);
Cheng-Chieh Hsieh, Gilbert, AZ (US);
Xuejiao Hu, Phoenix, AZ (US); Hakan Erturk, Chandler, AZ (US); George Chen, Los Gatos, CA (US)

(73) Assignee: Intel Corporation, Santa Clara, CA (US)

( * ) Notice: Subject to any disclaimer, the term of this patent is extended or adjusted under 35 U.S.C. 154(b) by 11 days.

(21) Appl. No.: 12/286,708

(22) Filed: Sep. 30, 2008

(65) Prior Publication Data
US 2010/0079955 A1 Apr. 1, 2010

(51) Int. Cl.
*H05K 7/20* (2006.01)
*F28F 7/00* (2006.01)
*H01L 23/34* (2006.01)

(52) U.S. Cl. ....... 361/703; 165/80.2; 165/185; 257/722; 361/704; 361/715

(58) Field of Classification Search .................. None
See application file for complete search history.

(56) References Cited

U.S. PATENT DOCUMENTS

| 5,850,162 | A * | 12/1998 | Danielsons | 330/149 |
| 6,771,508 | B1 * | 8/2004 | Ghosh | 361/704 |
| 7,592,695 | B2 * | 9/2009 | Reis et al. | 257/706 |
| 2005/0117301 | A1 * | 6/2005 | Prasher et al. | 361/699 |
| 2005/0126766 | A1 * | 6/2005 | Lee et al. | 165/133 |
| 2005/0129928 | A1 * | 6/2005 | Lee et al. | 428/323 |
| 2005/0136969 | A1 * | 6/2005 | Park | 455/550.1 |
| 2008/0049190 | A1 * | 2/2008 | Destain et al. | 353/20 |
| 2008/0089029 | A1 * | 4/2008 | Launay et al. | 361/697 |
| 2008/0137304 | A1 * | 6/2008 | Reis et al. | 361/709 |
| 2008/0310108 | A1 * | 12/2008 | Eriksson et al. | 361/697 |
| 2009/0033880 | A1 * | 2/2009 | Heo et al. | 353/52 |
| 2009/0237881 | A1 * | 9/2009 | Harris | 361/695 |

OTHER PUBLICATIONS

Kurabayashi, K (1998) "Thermal Transport Properties of Organic Films for Advanced VLSI Systems (Doctoral Dissertation)"; http://thermosciences.stanford.edu/pdf/TSD-115.pdf, 150 pages.

* cited by examiner

*Primary Examiner* — Gregory Thompson
(74) *Attorney, Agent, or Firm* — Blakely, Sokoloff, Taylor & Zafman LLP

(57) ABSTRACT

The present invention discloses a method of cooling an ultramobile device with microfins attached to an external wall of an enclosure surrounding the ultramobile device.

12 Claims, 3 Drawing Sheets

US 8,054,629 B2

MICROFINS FOR COOLING AN ULTRAMOBILE DEVICE

BACKGROUND OF THE INVENTION

1. Field of the Invention

The present invention relates to a field of heat transfer and, more specifically, to an apparatus for and method of cooling an ultramobile device.

2. Discussion of Related Art

Haven shrunken to a size of 2-3 business cards, an ultramobile device has also become versatile enough for web browsing, instant messaging, texting, e-mailing, voice telephony, listening to music, or watching streaming video.

However, power requirements will continue to increase as sophisticated users demand even more functionality from the ultramobile device. Consequently, the necessity of packing denser electronic components in closer proximity will generate more heat during operation of the ultramobile device.

A device failure rate doubles for each rise of 10 degrees Centigrade in junction temperature of the device. In order to avoid degrading best-case performance or compromising long-term reliability, heat dissipation for the ultramobile device should be improved.

However, a cooling solution should not occupy unreasonable space or incur disproportionate weight. Just as importantly, the cooling solution should not burden the battery excessively. Thus, a need exists for an apparatus for and a method of cooling the ultramobile device effectively.

DETAILED DESCRIPTION OF THE PRESENT INVENTION

In the following description, numerous details of specific materials, features, dimensions, processes, and sequences are set forth to provide a thorough understanding of the present invention. However, in some instances, one skilled in the art will realize that the invention may be practiced without these particular details. In other instances, one skilled in the art will also realize that certain well-known details have not been described so as to avoid obscuring the present invention.

Figure 1:
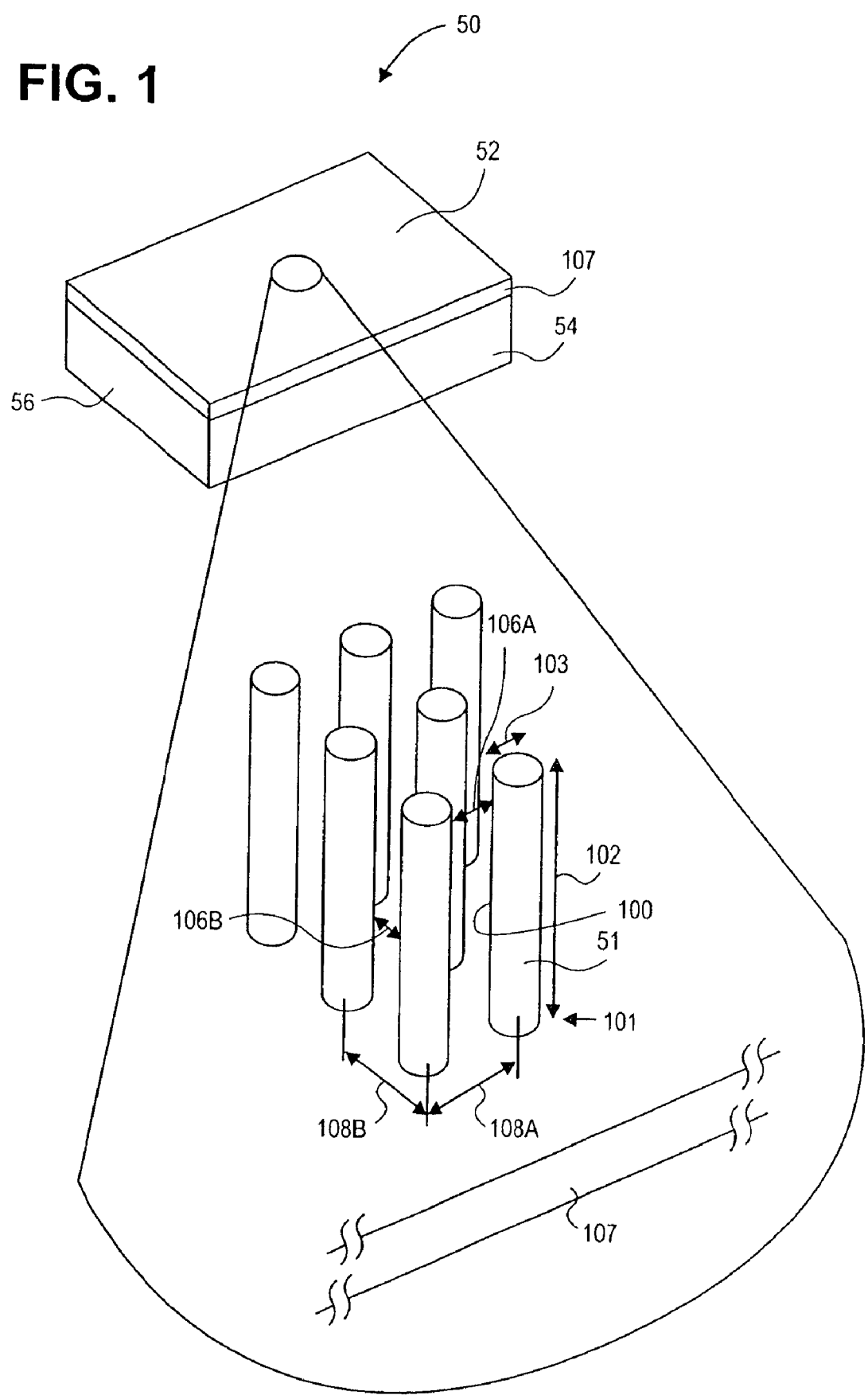
FIG. 1 shows a pin microfin arranged in an array on an external wall of an enclosure for an ultramobile device according to an embodiment of the present invention.

As shown in an embodiment of the present invention in FIG. 1, an ultramobile device is packaged within an enclosure 50 that removes heat generated internally and that protects against hazards encountered externally.

In an embodiment of the present invention, the enclosure 50 may include a single-piece, or unibody, construction.

In an embodiment of the present invention, the enclosure 50 is formed from a metal, such as aluminum. In an embodiment of the present invention, the enclosure 50 is formed from an alloy, such as magnesium alloy. Metal and alloy are stronger and have higher thermal conductivity, but are heavier and more difficult to form into complex shapes.

In an embodiment of the present invention, the enclosure 50 is formed from a polymer, such as acrylonitrile-butadiene-styrene (ABS) resin or polycarbonate-ABS resin. Polymers are lighter and easier to form into complex shapes, but are weaker and have lower thermal conductivity.

In an embodiment of the present invention, the enclosure 50 may include a hybrid construction. In an embodiment of the present invention, the enclosure 50 has a lower portion that is formed from metal or alloy and an upper portion that is formed from polymer.

The enclosure 50 may include several cavities (not shown) separated by internal partitions or walls (not shown). The cavities may be occupied by various components or devices (not shown) of the ultramobile device.

A cavity within the enclosure 50 may include a printed circuit board or a motherboard. A microprocessor and support chips may be mounted on the motherboard. Another cavity may include a power management device, such as a power supply, transformer, inverter, or converter. Another cavity may include an energy storage device, such as a Lithium ion battery. Still another cavity may include a heat management device, such as a heat sink, a heat spreader, a heat pipe, a thermoelectric cooler, or an air mover, such as a blower or fan. Still another cavity may include a display device, such as a LCD monitor screen. Yet another cavity may include an input/output device, such as a keyboard, mouse, touch screen, stylus, microphone, speaker, or image sensor (camera). Yet another cavity may include a wireless device, such as a radio, antenna, tuner, or receiver. Other cavities may include a removable device, such as a solid-state memory stick, a hard drive, or a subscriber identity module (SIM) card.

During operation, the devices (of the ultra mobile device) housed in the cavities in the enclosure 50 become heat sources of varying intensity. The heat generated by the devices is distributed through the cavities in an interior of the enclosure 50 by conduction, convection, and, if a temperature is high enough, by radiation.

In an embodiment of the present invention, the transfer of heat (cooling) away from the heat sources, such as the devices, is active. Heat exchange and forced convection may extract heat to an exterior of the enclosure 50.

In an embodiment of the present invention, the transfer of heat (cooling) away from the heat sources, such as the devices, is passive. Conduction and natural convection through a vent may dissipate heat to the exterior of the enclosure 50.

A design power of the ultramobile device in combination with an external environment determines how a temperature decreases from the interior to the exterior of the enclosure 50. In an embodiment of the present invention, the cooling is non-steady state or transient. In an embodiment of the present invention, the cooling is steady state.

An external wall 107 of the enclosure 50 includes an external surface exposed to the external environment surrounding the ultramobile device. In an embodiment of the present invention, the external wall 107 has a thickness of 0.6-0.9 mm. In an embodiment of the present invention, the external wall 107 has a thickness of 0.9-1.2 mm. In an embodiment of the present invention, the external wall 107 has a thickness of 1.2-1.5 mm.

In an embodiment of the present invention, a temperature gradient exists across the thickness of the external wall 107 of the enclosure 50. In an embodiment of the present invention, the temperature gradient is a function of a location or position along the external wall 107 of the enclosure 50.

In an embodiment of the present invention, the enclosure 50 includes many sides. The sides may include unequal surface areas. In an embodiment of the present invention, some of the sides may be facing (opposing) each other across the cavities in the interior of the enclosure 50. In an embodiment of the present invention, the opposing sides include parallel planes.

In an embodiment of the present invention, the enclosure 50 includes two opposing sides 52 that have external surfaces with the largest surface areas. Another two opposing sides 56 have external surfaces with the smallest surface areas. Still another two opposing sides 54 have external surfaces with intermediate surface areas.

In an embodiment of the present invention, the two opposing sides 52 of the enclosure 50 with the largest surface areas cool and protect the front side and the back (rear) side of the ultramobile device. The front side may include a user interface, such as a display or a keyboard. The back side may include panels to access the devices (of the ultramobile device) housed in the cavities in the enclosure 50.

In an embodiment of the present invention, the two opposing sides 52 of the enclosure 50 with the largest surface areas cool and protect the top (upper) side and the bottom (lower) side of the ultramobile device. The top side may include a cover or lid that swings, flips, or slides open. The bottom side may include brackets to mechanically mount onto another structure, such as a docking station. The bottom side may include pins to electrically connect to another structure, such as a power supply or a battery recharger.

In an embodiment of the present invention, the front side of the ultramobile device is also the top side of the ultramobile device.

During operation of the ultramobile device, one or more sides of the external surface of the enclosure 50 may contact a portion of an object, such as a tabletop, or a user. The one or more sides of the external surface of the enclosure 50 in contact may remain the same or may change.

The portion of the user may include part of a head, such as a forehead, a temple, a cheek, an eye or an ear. The portion of the user may include part of a torso, such as a chest, waist, or back. The portion of the user may include part of a limb, such as a hand, a wrist, a forearm, an upper arm, a foot, an ankle, a calf, or a thigh.

The contact between the one or more sides of the external surface of the enclosure 50 and the portion of the user may be unintentional or intentional. The contact may be incidental or substantial. The contact may be fleeting or lengthy. The contact may be infrequent or frequent. The contact may be intermittent or continuous. The contact may be indirect (such as through clothing or a case) or direct. The contact may include a distance that varies from close proximity to actual contact.

In an embodiment of the present invention, one of the opposing sides 52 of the enclosure 50 with the largest surface area contacts the portion of the user. The external surface of the side 52 of the enclosure 50 has a skin temperature.

The present invention includes an apparatus for and a method of (a) cooling the external surface of the side 52 of the enclosure 50, (b) promoting performance and reliability of the enclosed devices of the ultramobile device, (c) controlling and limiting the skin temperature of the external surface of the side 52 of the enclosure 50, and (d) maintaining comfort and safety of the user within a range of operating parameters and conditions for the ultramobile device.

In an embodiment of the present invention, the skin temperature of the external surface of the side 52 of the enclosure 50 is 30-35 degrees Centigrade. In an embodiment of the present invention, the skin temperature of the external surface of the side 52 of the enclosure 50 is 35-40 degrees Centigrade. In an embodiment of the present invention, the skin temperature of the external surface of the side 52 of the enclosure 50 is 40-45 degrees Centigrade.

In general, conduction of heat may be increased by increasing a surface area (A) and/or a thermal conductivity coefficient (k). In most situations, increasing a thermal conductivity of the external surface of the side 52 of the enclosure 50 will increase conduction of heat (cooling) both in-plane (parallel to the external wall 107) and out-of-plane (perpendicular to the external wall 107) to the external environment. Increasing the surface area of the external surface of the side 52 of the enclosure 50 (without changing a volume of the interior enclosed by the enclosure 50) will increase the dissipation of heat both laterally along and also vertically through (a thickness) of the external wall 107 of the enclosure t50 to the external environment.

Many embodiments exist for increasing the conduction of heat by increasing the surface area and/or the thermal conductivity coefficient of the external surface of the side 52 of the enclosure 50. In an embodiment of the present invention, a material property of the external surface of the side 52 of the enclosure 50 will increase conduction of heat. In an embodiment of the present invention, a chemical composition of the external surface of the side 52 of the enclosure 50 will increase conduction of heat. In an embodiment of the present invention, a physical state of the external surface of the side 52 of the enclosure 50 will increase conduction of heat. In an embodiment of the present invention, a bulk morphology of the external surface of the side 52 of the enclosure 50 will increase conduction of heat. In an embodiment of the present invention, a macroscopic surface texture of the external surface of the side 52 of the enclosure 50 will increase conduction of heat. In an embodiment of the present invention, a microscopic surface roughness of the external surface of the side 52 of the enclosure 50 will increase conduction of heat.

In an embodiment of the present invention, the external wall 107 of the enclosure 50 is flat (planar). In an embodiment of the present invention, the external wall 107 of the enclosure 50 is curved (not shown). In an embodiment of the present invention, the external wall 107 is indented inwards (concave) towards the interior of the enclosure 50. In an embodiment of the present invention, the external wall 107 is protruding outwards (convex) towards the exterior of the enclosure 50. In an embodiment of the present invention, the curvature may be complex with a contour that is analogous but not identical to a clam shell.

In an embodiment of the present invention, a structure having an extended surface area, such as a microfin, is attached to the external wall 107 of the enclosure 50. In an embodiment of the present invention, the structure having an extended surface area, such as the microfin, is integrated with the external wall 107 of the enclosure 50.

Selection of the material and structure of the microfin depends on the mechanical, structural, physical, and thermal properties that are desired.

In an embodiment of the present invention, the microfin is formed from a material with a low thermal conductivity coefficient such as a polymer. In an embodiment of the present invention, the polymer includes polyethylene, polypropylene, or polystyrene. In another embodiment of the present invention, the polymer includes isoprene (rubber).

In an embodiment of the present invention, the microfin is formed from a material, such as carbon graphite, that has anisotropic, such as biaxial, thermal conductivity related to the bulk morphology of parallel sheets.

In an embodiment of the present invention, the microfin is formed from a fiber that has anisotropic, such as biaxial, thermal conductivity related to a large aspect ratio of a longer dimension relative to a shorter dimension.

In an embodiment of the present invention, the microfin is formed from a composite material. The composite material may include anisotropic, such as triaxial, thermal conductivity.

In an embodiment of the present invention, the composite material is homogeneous.

In an embodiment of the present invention, the composite material includes solid particles formed from a first material with high thermal conductivity embedded within a solid matrix formed from a second material with intermediate (moderate) thermal conductivity.

In an embodiment of the present invention, the composite material includes two phases, such as pores filled with a first material with low thermal conductivity distributed through a solid material formed with a second material with intermediate (moderate) thermal conductivity. The first material may include a gas, such as air or nitrogen. The second material may include a low-density polyurethane.

In an embodiment of the present invention, the composite material is heterogeneous.

In an embodiment of the present invention, the composite material includes a core formed from a first material with high thermal conductivity surrounded by a cladding formed from a second material with intermediate (moderate) thermal conductivity. The first material may include aluminum. The second material may include aluminum oxide.

In an embodiment of the present invention, the microfin is rigid. A rigid microfin only deforms slightly despite application of a large force (load). Rigidity refers to a material that has a Young's modulus of elasticity that is large so that a bend radius would be large. In an embodiment of the present invention, the microfin is formed from a moderately rigid material having a Young's modulus of elasticity of over 200 GPa. In an embodiment of the present invention, the microfin is formed from a rigid material having a Young's modulus of elasticity of over 1,000 GPa.

In an embodiment of the present invention, the microfin is stiff. A stiff microfin only deforms slightly despite application of a large force (load). Stiffness refers to a solid body formed from a certain material, having a certain shape, and placed under certain boundary conditions.

In an embodiment of the present invention, the microfin is tough. A tough microfin withstands application of a large force (load) without deforming or fracturing (cracking or breaking).

In an embodiment of the present invention, the microfin is flexible. A flexible microfin deforms easily upon application of a small force (load). The deformation is reversible (elastic) unless a threshold of force is exceeded.

The microfin has a characteristic geometry, shape, orientation, dimension, aspect ratio, and spacing. In an embodiment of the present invention, the microfin is discrete.

In an embodiment of the present invention as shown in FIG. 1, the microfin is a pin microfin 100. In an embodiment of the present invention, the pin microfin 100 includes a cross-section that is a circle or a regular polygon. In an embodiment of the present invention, the regular polygon is a square, a pentagon, or a hexagon.

Figure 2:
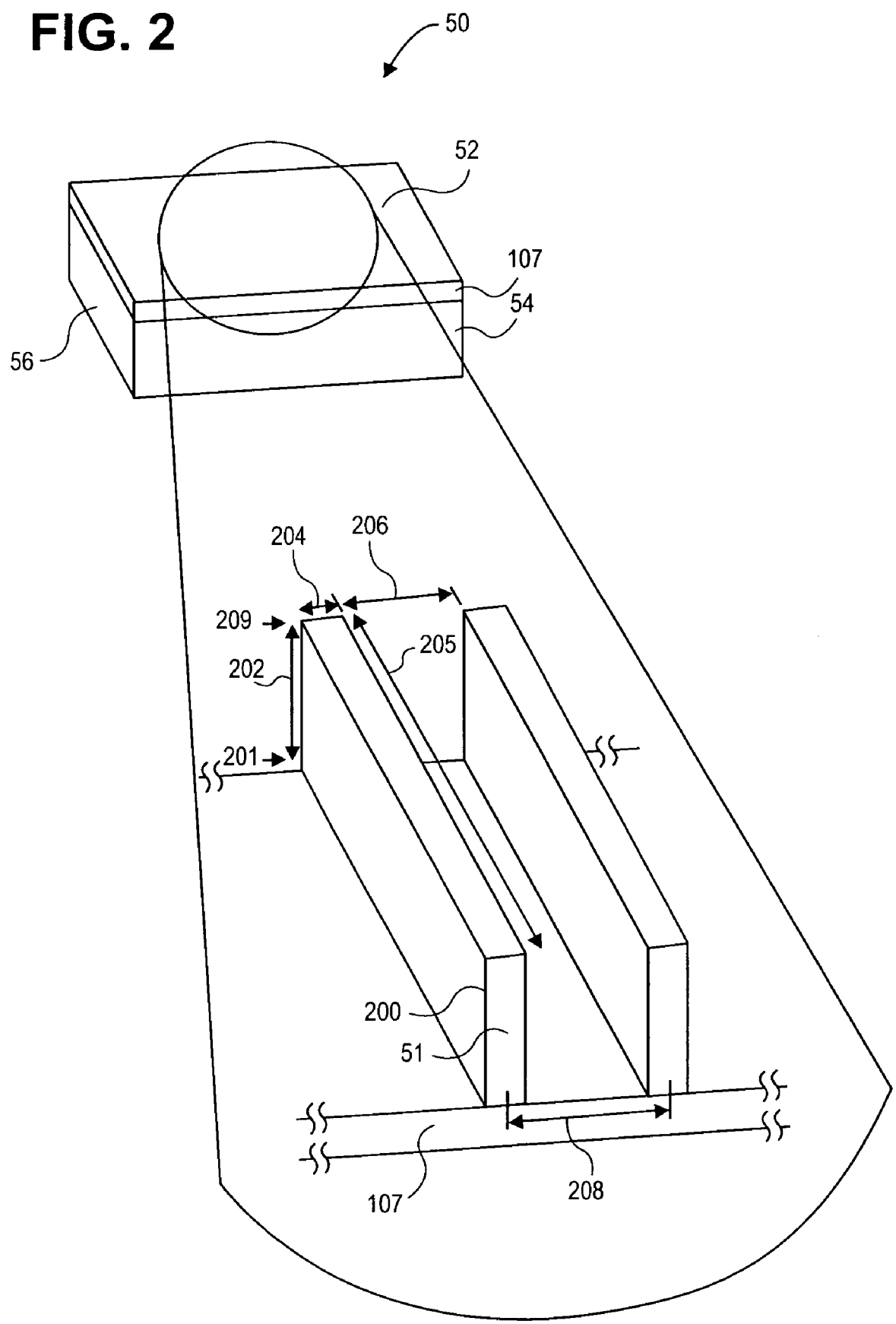
FIG. 2 shows a plane microfin arranged in an array on an external wall of an enclosure for an ultramobile device according to an embodiment of the present invention.

In an embodiment of the present invention as shown in FIG. 2, the microfin is a plane microfin 200. In an embodiment of the present invention, the plane microfin 200 includes a cross-section that is an irregular polygon. In an embodiment of the present invention, the irregular polygon is a rectangle. The corners of the rectangle may be sharp (90 degrees), tapered, faceted (greater than 90 degrees), or rounded.

In an embodiment of the present invention, the microfin has a complex cross-section, such as resembling a star (not shown) or an asterisk (not shown), to increase surface area (per unit volume) along the length of the microfin.

In an embodiment of the present invention, the microfin has a non-uniform cross-section. In an embodiment of the present invention, the microfin changes cross-section abruptly (either larger or smaller at each step) at consistent locations along its length.

In an embodiment of the present invention, the microfin has a variable cross-section. In an embodiment of the present invention, the microfin has a cross-section that decreases monotonically from a base to a tip.

In an embodiment of the present invention, the microfin is a microball (not shown) that is globular, oblate, or hemispherical.

The microfin may include a vertical dimension extending out, above, and perpendicular to the external wall 107. In an embodiment of the present invention, the vertical dimension may include a height 102, as shown in FIG. 1, for a pin microfin 100. In an embodiment of the present invention, the vertical dimension may include a height 202, as shown in FIG. 2, for a plane microfin 200. In an embodiment of the present invention, the height is 0.1-0.5 mm. In an embodiment of the present invention, the height is 0.5-1.5 mm. In an embodiment of the present invention, the height is 1.5-4.5 mm.

The microfin may include a lateral dimension extending along, across, and parallel to the external wall 107. The lateral dimension may include a diameter 103, as shown in FIG. 1, for a pin microfin 100. In an embodiment of the present invention, the diameter is 0.1-0.3 mm. In an embodiment of the present invention, the diameter is 0.3-0.6 mm. In an embodiment of the present invention, the diameter is 0.6-0.9 mm.

In an embodiment of the present invention, a ratio of the height to the diameter (H:D) is selected from a range of 1:1-4:1. In an embodiment of the present invention, a ratio of the height to the diameter (H:D) is selected from a range of 4:1-13:1. In an embodiment of the present invention, a ratio of the height to the diameter (H:D) is selected from a range of 13:1-45:1.

The lateral dimension may include a width 204, as shown in FIG. 2, for a plane microfin 200. In an embodiment of the present invention, the width is 0.1-0.3 mm. In an embodiment of the present invention, the width is 0.3-0.6 mm. In an embodiment of the present invention, the width is 0.6-0.9 mm.

In an embodiment of the present invention, a ratio of the height to the width (H:W) is selected from a range of 1:1-4:1. In an embodiment of the present invention, a ratio of the height to the width (H:W) is selected from a range of 4:1-13:1. In an embodiment of the present invention, a ratio of the height to the width (H:W) is selected from a range of 13:1-45:1.

The lateral dimension may include a length 205, as shown in FIG. 2, for a plane microfin 200. In an embodiment of the present invention, the length is as long as an edge of a side of the enclosure 50.

The microfin may include an edge-to-edge lateral (microfin) spacing 106A/106B, as shown in FIG. 1, for the pin microfin 100. The microfin may include an edge-to-edge lateral (microfin) spacing 206, as shown in FIG. 2, for the plane microfin 200. In an embodiment of the present invention, the lateral spacing is 0.05-0.15 mm. In an embodiment of the present invention, the lateral spacing is 0.15-0.30 mm. In an embodiment of the present invention, the lateral spacing is 0.30-0.45 mm.

The microfin may include a center-to-center lateral (microfin) pitch 108A/108B, as shown in FIG. 1, for the pin microfin 100. The microfin may include a center-to-center lateral (microfin) pitch 208, as shown in FIG. 2, for the plane microfin 200. In an embodiment of the present invention, the pitch is 0.15-0.45 mm. In an embodiment of the present invention, the pitch is 0.45-0.90 mm. In an embodiment of the present invention, the pitch is 0.90-1.35 mm.

In an embodiment of the present invention, the microfins are arranged in a layout that is repeating (periodic). In an embodiment of the present invention, the placement of the microfins may be in-line or staggered (not shown). In an embodiment of the present invention, the layout of the microfins may be irregular in part or in entirety.

In an embodiment of the present invention, the microfins are organized in a closely-packed pattern, such as an array. The arrays may be discrete, adjacent, contiguous, overlapping, interlocking, or nested. The arrays may include sub-arrays.

In an embodiment of the present invention, the microfins are unidirectional. In an embodiment of the present invention, the microfins are unbranched. In an embodiment of the present invention, the microfins are multidirectional, such as flexible (not shown). In an embodiment of the present invention, the microfins are branched (not shown).

Figure 3:
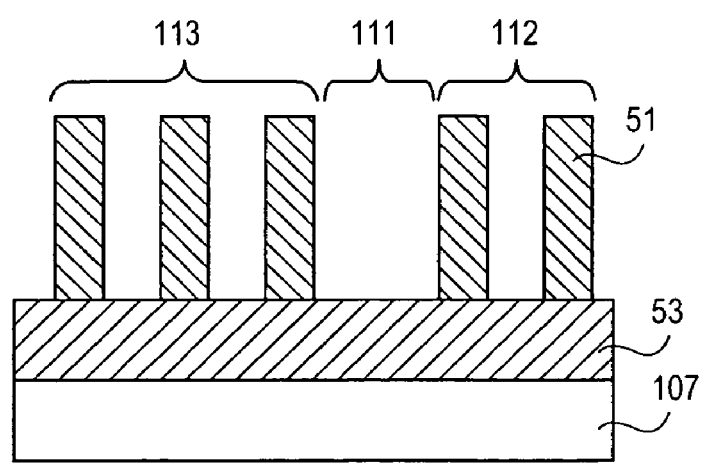
FIG. 3 shows microfins in arrays of different sizes that are located above a distribution layer that is located above an external wall of an enclosure for an ultramobile device according to an embodiment of the present invention.
Figure 5:
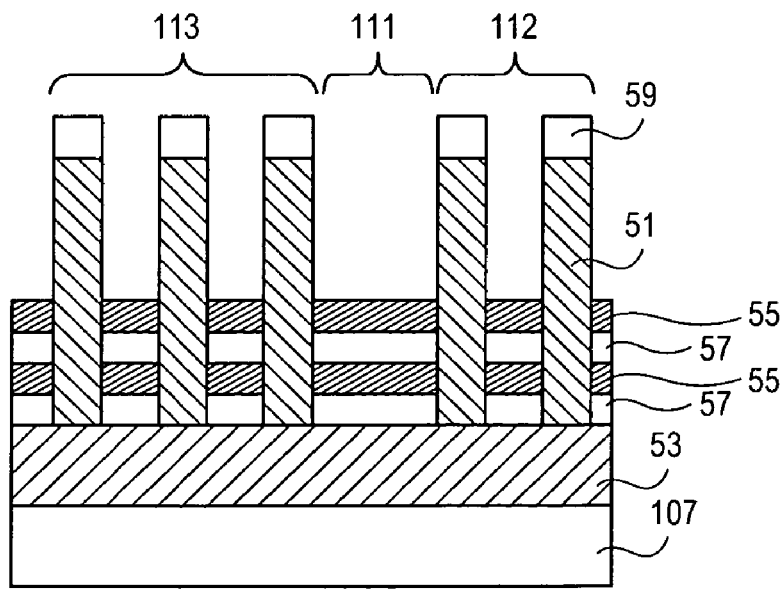
FIG. 5 shows microfins in arrays of different sizes that are located above a distribution layer that is located below a laminated layer and above an external wall of an enclosure for an ultramobile device according to an embodiment of the present invention.

In an embodiment of the present invention as shown in FIG. 3, the microfins 51 are linked at their base through a distribution layer 53. In an embodiment of the present invention, the microfins are intertwined (not shown), such as with barbs. In an embodiment of the present invention, as shown in FIG. 5 the microfins 51 form a cross-linked network through the distribution layer 53 at their base, as well as, through the laminated layer 55/57 along their height. In an embodiment of the present invention, the microfins form a webbed network (not shown).

In an embodiment of the present invention, a low thermal conductivity includes 0.01-0.40 W/m-K at 25 C, such as foam insulation, aerogel, air, and epoxy. In an embodiment of the present invention, a low thermal conductivity includes 0.4-3 W/m-K at 25 C, such as water, carbon, or glass.

In an embodiment of the present invention, an intermediate (moderate) thermal conductivity includes 3-10 W/m-K at 25 C. In an embodiment of the present invention, an intermediate (moderate) thermal conductivity includes 10-35 W/m-K at 25 C, such as lead or aluminum oxide.

In an embodiment of the present invention, a high thermal conductivity includes 35-85 W/m-K at 25 C, such as iron, steel, or tin. In an embodiment of the present invention, a high thermal conductivity includes 85-160 W/m-K at 25 C, such as nickel or zinc.

In an embodiment of the present invention, a very high thermal conductivity includes 160-400 W/m-K at 25 C, such as aluminum. In an embodiment of the present invention, a very high thermal conductivity includes 400-1,000 W/m-K at 25 C.

In an embodiment of the present invention, the microfins are formed from a material with a high in-plane thermal conductivity and a low out-of-plane thermal conductivity where the plane includes the external wall 107 of the enclosure 50.

In an embodiment of the present invention, the ratio of the high in-plane thermal conductivity to the low out-of-plane thermal conductivity is 2:1-5:1. In an embodiment of the present invention, the ratio of the high in-plane thermal conductivity to the low out-of-plane thermal conductivity is 5:1-12:1. In an embodiment of the present invention, the ratio of the high in-plane thermal conductivity to the low out-of-plane thermal conductivity is 12:1-30:1.

In an embodiment of the present invention, the microfins are formed from a material with an in-plane thermal conductivity of 250 W/m-K and an out-of-plane thermal conductivity of 20 W/m-K.

In an embodiment of the present invention, the temperature of the tip of the microfin is 30-35 degrees Centigrade. In an embodiment of the present invention, the temperature of the tip of the microfin is 35-40 degrees Centigrade. In an embodiment of the present invention, the temperature of the tip of the microfin is 40-45 degrees Centigrade.

In an embodiment of the present invention, the temperature of the tip of the microfin is 0.5-2.0 degrees Centigrade lower than the temperature of the external surface of the enclosure. In an embodiment of the present invention, the temperature of the tip of the microfin is 2.0-3.5 degrees Centigrade lower than the temperature of the external surface of the enclosure. In an embodiment of the present invention, the temperature of the tip of the microfin is 3.5-5.0 degrees Centigrade lower than the temperature of the external surface of the enclosure.

In an embodiment of the present invention, the temperature of the outer, distal, or peripheral end (tip) of the microfin is 0.5-2.0 degrees Centigrade lower than the temperature of the inner, proximal end (base or root) of the microfin. In an embodiment of the present invention, the temperature of the tip of the microfin is 2.0-3.5 degrees Centigrade lower than the temperature of the base (root) of the microfin. In an embodiment of the present invention, the temperature of the tip of the microfin is 3.5-5.0 degrees Centigrade lower than the temperature of the base (root) of the microfin.

As shown in an embodiment of the present invention in FIG. 3, a distribution layer 53 having a high thermal conductivity is located above (over) the external wall 107 to increase conduction of heat in-plane (parallel to the external wall 107) more than out-of-plane (perpendicular to the external wall 107) to the external environment.

As shown in an embodiment of the present invention in FIG. 3, a microfin 51 having a high thermal conductivity is located above (over) the distribution layer 53 and protrudes towards the exterior of the enclosure 50.

In an embodiment of the present invention, the microfin 51 is arranged in arrays of different sizes, shown schematically in FIG. 3 as a first array 111 with no microfin, a second array 112 with some microfins, and a third array 113 with many microfins. The size of an array refers to the number of microfins in the array. In an embodiment of the present invention, the microfin arrays of different sizes are located over cavities of different sizes in the enclosure 50 for the ultramobile device.

In an embodiment of the present invention, the microfin 51 is arranged in arrays of different densities (not shown). The density of an array refers to the microfin spacing or pitch in the array. In an embodiment of the present invention, the microfin arrays of different densities are located over heat sources having varying intensity in the enclosure 50.

As shown in an embodiment of the present invention in FIG. 4, a distribution layer 53 having a high thermal conductivity is located below (under) the external wall 107 to increase conduction of heat in-plane (parallel to the external surface of the external wall 107) more than out-of-plane (perpendicular to the external surface of the external wall 107) to the external environment.

Figure 4:
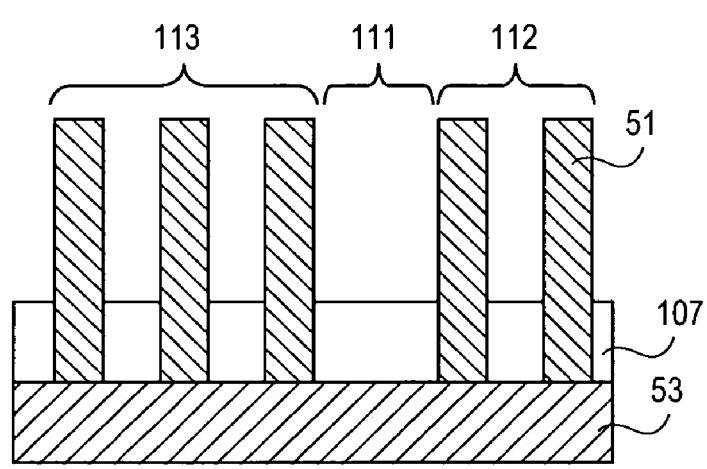
FIG. 4 shows microfins in arrays of different sizes that are located above a distribution layer that is located below an external wall of an enclosure for an ultramobile device according to an embodiment of the present invention.

As shown in an embodiment of the present invention in FIG. 4, a microfin 51 having a high thermal conductivity is located in openings (holes) in the external wall 107 and is located above (over) the distribution layer 53, and protrudes towards the exterior of the enclosure 50.

In an embodiment of the present invention, the microfin 51 is arranged in arrays of different sizes, shown schematically in FIG. 4 as a first array 111 with no microfin, a second array 112 with some microfins, and a third array 113 with many microfins. The size of an array refers to the number of microfins in the array. In an embodiment of the present invention, the microfin arrays of different sizes are located over cavities of different sizes in the enclosure 50 for the ultramobile device.

In an embodiment of the present invention, the microfin 51 is arranged in arrays of different densities (not shown). The density of an array refers to the microfin spacing or pitch in the array. In an embodiment of the present invention, the microfin arrays of different densities are located over heat sources having varying intensity in the enclosure 50.

As shown in an embodiment of the present invention in FIG. 5, a distribution layer 53 having a high thermal conductivity is located above (over) the external wall 107 to increase conduction of heat in-plane (parallel to the external surface of the external wall 107) more than out-of-plane (perpendicular to the external surface of the external wall 107) to the external environment.

As shown in an embodiment of the present invention in FIG. 5, a microfin 51 having a high thermal conductivity is located in openings (holes) in an overlying laminated layer 55/57, and is located above (over) the distribution layer 53, and protrudes towards the exterior of the enclosure 50. The laminated layer 55/57 includes alternating layers of a first material 55 with high thermal conductivity and a second material 57 with low thermal conductivity.

In an embodiment of the present invention, the laminated layer 55/57 and the distribution layer 53 may be integrated into a one-piece structure (not shown).

As shown in an embodiment of the present invention in FIG. 5, a cap 59 having a low thermal conductivity is located above (over) the tip of the microfin 51. In an embodiment of the present invention, an interface between the cap 59 and the microfin 51 is abrupt. In an embodiment of the present invention, a boundary between the cap 59 and the microfin 51 is gradual.

In an embodiment of the present invention, upon application of force by contact with the user (not shown), the microfin 51 deflects its flexible body, touches neighboring microfins, and conducts heat from microfin-to-microfin.

In an embodiment of the present invention, the microfin 51 is arranged in arrays of different sizes, shown schematically in FIG. 5 as a first array 111 with no microfin, a second array 112 with some microfins, and a third array 113 with many microfins. The size of an array refers to the number of microfins in the array. In an embodiment of the present invention, the microfin arrays of different sizes are located over cavities of different sizes in the enclosure 50 for the ultramobile device.

In an embodiment of the present invention, the microfin 51 is arranged in arrays of different densities (not shown). The density of an array refers to the microfin spacing or pitch in the array. In an embodiment of the present invention, the microfin arrays of different densities are located over heat sources having varying intensity in the enclosure 50.

In another embodiment of the present invention, the microfin 51 is thermally connected with the distribution layer 53 and the external wall 107 of the side 52 of the enclosure 50, either indirectly or remotely (not shown), and protrudes towards the exterior of the enclosure.

In another embodiment of the present invention, the microfin 51, the distribution layer 53, and the external wall 107 are all designed and integrated seamlessly into a one-piece structure that protrudes towards the exterior of the enclosure 50 (not shown).

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

We claim:

1. An apparatus for passively cooling an ultramobile device comprising:
    microfins attached to an external wall of an enclosure of said ultramobile device wherein said external wall has a plane and wherein said microfins comprise a high in-plane thermal conductivity parallel to the plane of said external wall and a low out-of-plane thermal conductivity perpendicular to the plane of said external wall.

2. The apparatus of claim 1 wherein said microfins comprise polymer.

3. The apparatus of claim 1 wherein said microfins comprise rubber.

4. The apparatus of claim 1 wherein said microfins comprise carbon graphite.

5. The apparatus of claim 1 wherein said microfins comprise fiber.

6. The apparatus of claim 1 wherein said microfins comprise a composite material that is homogeneous.

7. The apparatus of claim 1 wherein said microfins are stiff.

8. The apparatus of claim 1 wherein said microfins comprise pin microfins, said pin microfins having a height above said external wall and a diameter across said external wall.

9. An apparatus for passively removing heat from an ultramobile device comprising:
    an enclosure with a plurality of external walls wherein each external wall has a plane;
    a plurality of devices contained within said enclosure; and,
    a plurality of pin microfins attached to at least one of said plurality of external walls wherein said pin microfins extend outwards perpendicularly from said external wall wherein each of said pin microfins has a vertical dimension and a lateral dimension wherein the vertical dimension is perpendicular to said external wall, the lateral dimension is parallel to said external wall, and the vertical dimension is greater than the lateral dimension and wherein each of said pin microfins exhibits greater thermal conductivity along its lateral dimension than along its vertical dimension.

10. The apparatus of claim 9 wherein said enclosure includes a plurality of internal cavities and each of said cavities contains a device.

11. The apparatus of claim 10 wherein said devices are selected from the group consisting of an electronic component, a display component, an input/output device, a sensor, a wireless device, a heat management device, or an energy storage device.

12. The apparatus of claim 10 wherein one of said external walls comprises of a user interface such as a display or keyboard.

* * * * *